United States Patent [19]
Brown et al.

[11] Patent Number: 5,910,923
[45] Date of Patent: Jun. 8, 1999

[54] MEMORY ACCESS CIRCUITS FOR TEST TIME REDUCTION

[75] Inventors: Brian L. Brown; David R. Brown, both of SugarLand; Daniel B. Penney, Houston; Roger D. Norwood, SugarLand, all of Tex.

[73] Assignee: Texas Instruments Incorporated, Dallas, Tex.

[21] Appl. No.: 08/956,410

[22] Filed: Oct. 23, 1997

[51] Int. Cl.⁶ .................................................. G11C 13/00
[52] U.S. Cl. ..................................... 365/201; 365/230.03
[58] Field of Search .............................. 365/201, 189.01, 365/230.03

[56] References Cited

U.S. PATENT DOCUMENTS 5,499,216  3/1996  Yamamoto ...................... 365/230.03

*Primary Examiner*—Terrell W. Fears
*Attorney, Agent, or Firm*—Lawwrence J. Bassuk; Richard L. Donaldson

[57] ABSTRACT

Testing of an integrated circuit having arrays of memory cells occurs by writing to all of the arrays at the same time. Normal writing occurs only to one array. Additional test data bus leads on the chip carry test data signals from selected arrays to comparison circuits. The outputs of the comparison circuits flow to the output circuits of the chip. This achieves writing test data to four times the number of arrays as in a normal write and reading test data from twice the number of arrays as in a normal read operation.

6 Claims, 2 Drawing Sheets

MEMORY ACCESS CIRCUITS FOR TEST TIME REDUCTION

FIELD OF THE INVENTION

This invention relates generally to testing integrated circuits and particularly relates to circuits carried in a DRAM to reduce testing time.

DESCRIPTION OF THE RELATED ART

The manufacture of integrated circuits generally involves hundreds of individual manufacturer or process steps. This applies to DRAMs particularly. While any generalization of such multitude of operations necessarily omits much defining detail, the manufacturer of ICs can be generally described with four major divisions: prepare blank wafers of semiconductor material, such as silicon; process the blank wafers to form multiple chips containing the desired circuits; package the individual chips and subject the packaged chips to elevated temperature and voltage operating conditions to eliminate early failing chips, i.e. perform burn-in testing. This last step helps insure reliability.

Electrical function and parametric testing occurs during and after processing and after burn-in to ascertain the good electrical chips that are available for further manufacturing steps. The first electrical test of DRAM circuits is known as laser probe. This phrase refers to electrical function testing performed to determine circuits that can be repaired by laser blowing fuses in redundancy circuits. This improves the yield of good chips. The second electrical test of DRAMs is known as multiprobe test. This test applies multiple probes to each chip in determining the function and parameters of the chip prior to packaging. The final electrical test confirms the operability of the chips and is used to sort them by parameters such as speed.

One of the primary bottlenecks in production of integrated circuits generally and memory circuits in particular is the time it takes fully to test a part. The testing insures that the part works and that it meets product specifications.

One method used to reduce testing time is parallel testing of the circuits on the chip. Particularly in memory parts with large arrays of addressable bits, many different bits in the arrays are tested simultaneously. The many different tested bits are then compared to one another on the chip and a pass or fail pattern is presented on the I/O pins of the packaged device. One limitation to this parallel testing of the arrays is the number of bits that can be carried by the internal data bus leads on the chip between the arrays and the compare circuits. The number of internal data bus leads determine the number of bits that can be tested simultaneously. The usual method of implementing parallel test in a memory device thus tests in parallel only the number of bits that can be physically read over the internal data bus leads.

The ability simultaneously to test more bits of memory than can be carried by the internal data bus leads would decrease testing time and reduce manufacturing costs.

SUMMARY OF THE INVENTION

The disclosed embodiment provides additional circuits and circuit arrangements for writing test data to four times the number of memory cells as in a normal write operation and for reading test data from two times the number of memory cells as in a normal read operation. This reduces the test write time by a factor of four and the test read time by a factor of two. Additional test time reduction can occur by increasing the number of additional test circuits and test data busses at a cost of a larger area chip.

In particular, the disclosed embodiment uses the respective four data selectors for the four memory arrays to pass write test data to all four arrays at the same time. Additional test data selectors pass read test data from two selected arrays across two additional test data busses of leads to comparison circuits. The result of the comparison at the outputs of the comparison circuits pass to the output drivers for the chip to indicate a correct or incorrect operation of the addressed data bit locations.

The disclosed comparison occurs as the result of an exclusive-NOR gating.

BRIEF DESCRIPTION OF THE DRAWING FIGURES

DETAILED DESCRIPTION

Figure 1:
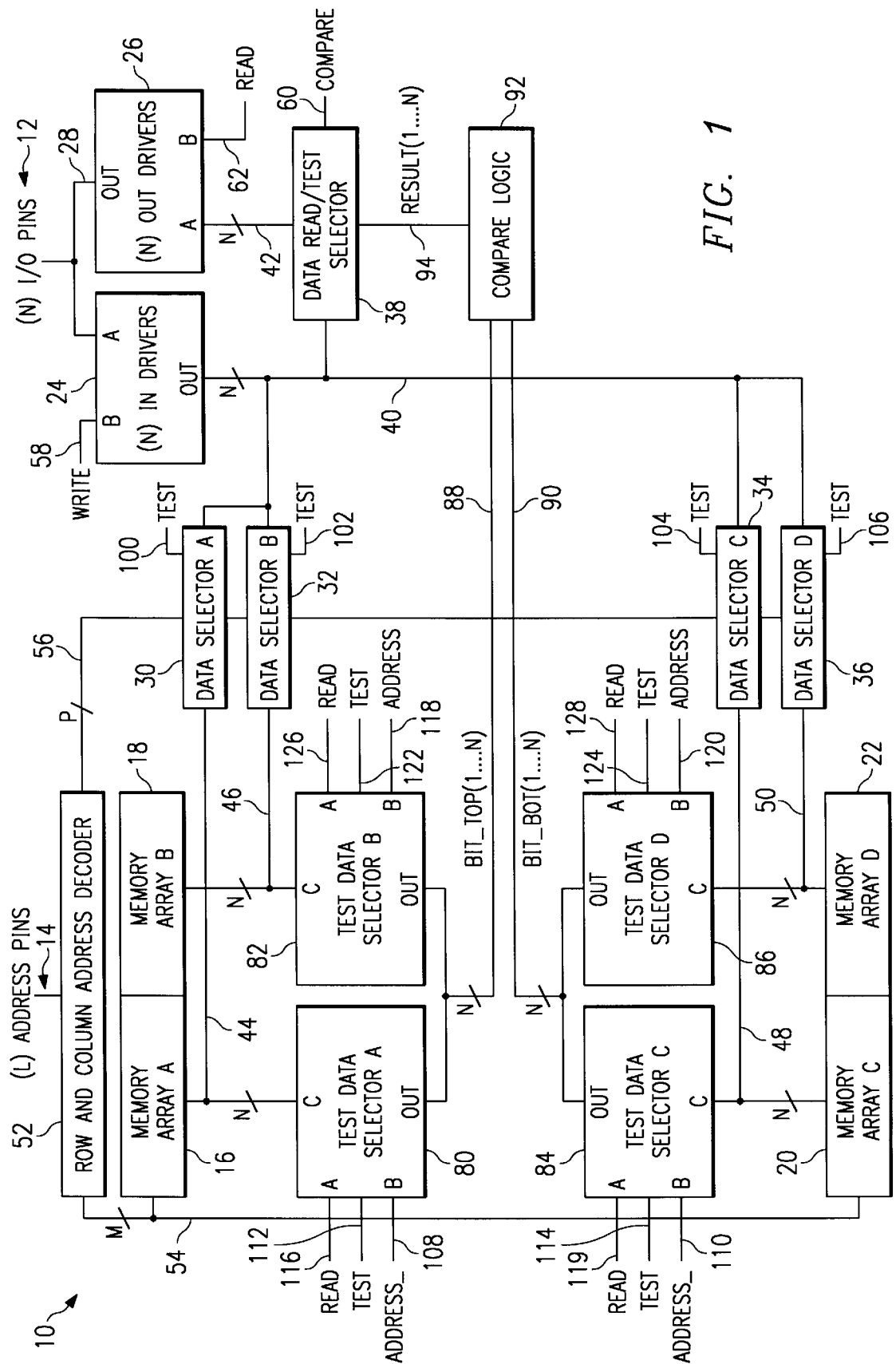
FIG. 1 is a block diagram of a memory part containing the data access configuration of the present invention.

In FIG. 1, integrated circuit 10, a memory device, comprises (N) I/O data pins 12, (L) address pins 14 and plural memory arrays such as memory arrays 16, 18, 20 and 22. Input driver circuits 24 and output driver circuits 26 connect to the I/O data pins 12 by leads 28 that are N bits wide. The output of the input driver circuits 24 connect to data selector circuits A, B, C and D 30, 32, 34 and 36 and to data read/test selector circuits 38 by leads 40. Data read/test circuits 38 connect to the data output driver circuits 26 by leads 42. Leads 40 and 42 are N bits wide and form an internal data bus on the integrated circuit and are used for normally reading and writing words of data at one time.

Data selector circuits A 30 connect to array 16 by leads 44. Data selector-circuits B 32 connect to array 18 by leads 46. Data selector circuits C 34 connect to array 20 by leads 48, and data selector circuits D 36 connect to array 22 by leads 50. All of leads 44, 46, 48 and 50 are N bits wide to convey whole words of data to and from the selected arrays.

Row and column address decoder circuits 52 receive the address signals applied to the (L) address pins 14. The row and column address decoder circuits 52 produce row address select signals on (M) row select leads 54 and produce column select signals on (P) column select leads 56. The (M) row select leads 54 connect to the four arrays of memory cells 16, 18, 20 and 22 for selecting individual rows of memory cells. The (P) column select leads 56 connect to the data selector circuits A, B, C and D 30, 32, 34 and 36 for selecting columns of memory cells to be written to and read from during normal write and read operations.

Integrated circuit 10 includes additional well-known circuits necessary for operation of the device that are omitted from the drawing of FIG. 1 to facilitate description of the invention. The size and arrangement of these omitted circuits and the depicted memory arrays 16, 18, 20 and 22 can be as desired while remaining within the scope of the invention. The decoding of the rows and columns and data selection can be arranged as desired to meet desired chip size, speed, power, data word size or other specifications.

In a normal write operation, row and column address signals are applied to the (L) address pins and data signals are applied to the (N) I/O pins. In response to a write signal on lead 58 applied to input driver circuits 24, the data signals pass through the input driver circuits, through one of the addressed data selector circuits A, B, C or D 30, 32, 34 or 36 and to the addressed memory cells in one of arrays 16, 18, 20 or 22.

In a normal read operation, row and column address signals are applied to the (L) address pins 14. In response to the activated row select signals on leads 54, the data bits in the selected rows in all of the arrays are conveyed to the data selector circuits 30, 32, 34 and 36 on leads 44, 46, 48 and 50. In response to the activated column select signals on leads 56, one of the data select circuits 30, 32, 34 or 36 conveys the data bits from its respective array to the data read/test selector circuits 38 on bus leads 40. In response to the compare signal on compare lead 60 being inactive, the data bits pass through the selector circuits to the output driver circuits 26 on leads 42. With the read signal on read lead 62 active, the data bits pass through the output driver circuits to the (N) I/O pins 12 on leads 28.

Testing of integrated circuit 10 to insure the operation of all the memory bits could occur by using normal write and read operations. With a typical memory device containing about 16 million (binary) bits of information and being arranged in one million words of 16 bits per word, a test operation would require writing one million words of data and reading one millions words of data for each test routine. This test time can be reduced by writing or reading data in parallel from all of the arrays at one time.

The present invention provides additional circuits for performing testing of the integrated circuit 10. Test data selector circuits A 80 selectively connect the data signals on leads 44 to BIT_TOP leads 88. Test data selector circuits B 82 selectively connect the data signals on leads 46 to BIT_TOP leads 88. Test data selector circuits C 84 selectively connect the data signals on leads 48 to BIT_BOT leads 90, and test data selector circuits D 86 selectively connect the data signals on leads 50 to BIT_BOT leads 90.

Leads 88 and 90 carry the selected data signals to compare circuits 92. Compare circuits 92 perform a logical comparison function, in this case an exclusive-NOR gating, on the two sets of data signals from leads 88 and 90. The compare circuits 92 present the result of the comparison on leads 94 to the data read/test selector circuits 38.

For a test operation, the integrated circuit 10 is placed in a test mode by any means desired, such as an overvoltage on a certain pin. Other circuits (not shown) on the integrated circuit recognize the overvoltage indication and produce internal test signals.

For a test write operation, the test data is applied to the (N) I/O pins 12 and address signals are applied to the (L) address pins 14. The input driver circuits 24 pass the received data signals to the internal data bus leads 40. All four of the data selector circuits A, B, C and D 30, 32, 34 and 36 become active in response to the test signals applied to them on leads 100, 102, 104 and 106. All four of these data selector circuits pass the data to their respective memory array where the data is written into the addressed memory cells. Thus, this test write operation writes four times the data applied to the data pins to the memory cells.

For a test read operation, all four of the arrays are addressed in a normal fashion by address signals applied to the (L) address pins 14. Data bit signals thus occur on all four sets of memory bus leads 44, 46, 48 and 50. Test data selector circuits A 80 and C 84 become selected by application of active state address_signals on leads 108 and 110, the test signals on leads 112 and 114 and the read signals on leads 116 and 119. The data bit signals on bus leads 44 and 48 thus are passed to BIT_TOP leads 88 and BIT_BOT leads 90 for comparison in compare logic circuits 92. Test data selector circuits B 82 and D 86 become selected by application of active state address signals on leads 118 and 120, the test signals on leads 122 and 124 and the read signals on leads 126 and 128. The data bit signals on bus leads 48 and 50 thus are passed to BIT_TOP leads 88 and BIT_BOT leads 90 for comparison in compare logic circuits 92.

In either event, the result of the comparison occurs on leads 94 and are passed by data read/test selector circuits 38 to the output driver circuits and the I/O pins in response to the compare signal on lead 60 and the read signal on lead 62. A test read operation thus occurs on twice the number of memory cells than a normal read operation.

Figure 2:
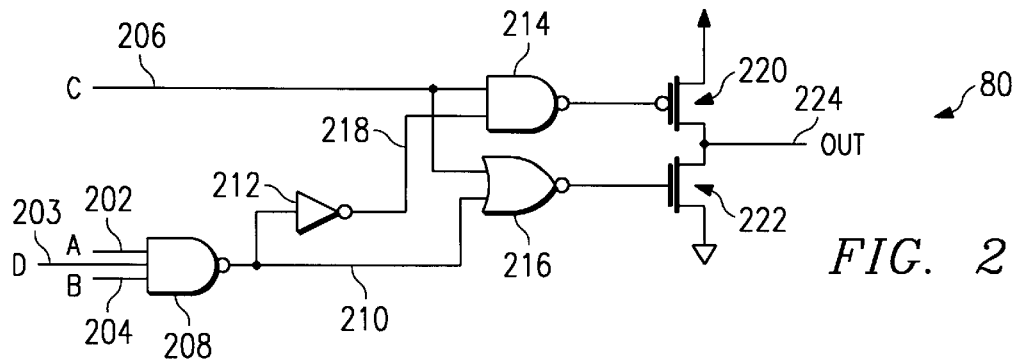
FIG. 2 is a schematic diagram of a data select circuit used with the invention.

In FIG. 2, a data select circuit 80 that could be used in the embodiment of integrated circuit 10 receives control signals A, B and C on leads 202, 204 and 203 that are used to transfer and inhibit the data signal carried in lead 206. The output of NAND gate 208 on lead 210 connects to the inputs of inverter 212 and NOR gate 216. The output of inverter 212 on lead 218 connects to the input of NAND gate 214. Lead 206 connects to the other inputs of NAND gate 214 and NOR gate 216.

When all of signals A, B and C are active high, the circuit 80 transmits the data on lead 206 to the totem pole arranged P-channel transistor 220 and N-channel transistor 222 to produce a like data signal on output lead 224. When any one of signals A, B or C are inactive low, the circuit prevents the transmission of the data signal from lead 206 to lead 224 and the output will take a high impedance state.

Figure 3:
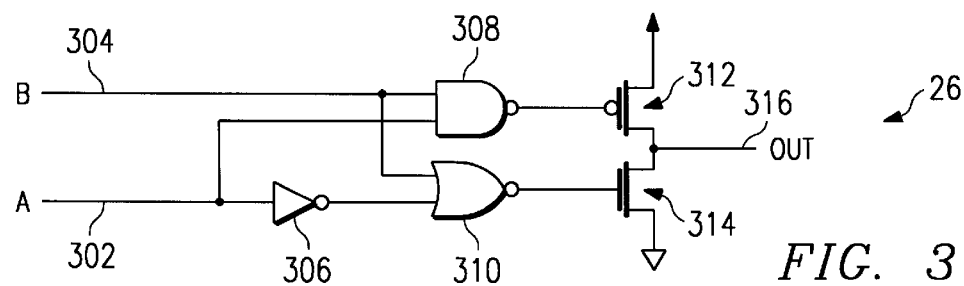
FIG. 3 is a schematic diagram of an I/O driver circuit used with the invention.

In FIG. 3, an I/O driver circuit 26 that could be used in the embodiment of integrated circuit 10 receives a control signal A on lead 302 to transmit and inhibit a data signal B on lead 304. Lead 302 connects to the input of inverter 306 and NAND gate 308. Data signal B on lead 304 connects to NAND gate 308 and NOR gate 310. The output of inverter 306 connects to the input of NOR gate 310.

When signal A is active high, the circuit 26 transmits the data on lead 304 to the totem pole arranged P-channel transistor 312 and N-channel transistor 314 to produce a like data signal on output lead 316. When signal A is inactive low, the circuit prevents the transmission of the data signal from lead 304 to lead 316 and the output will take a high impedance state.

Figure 4:
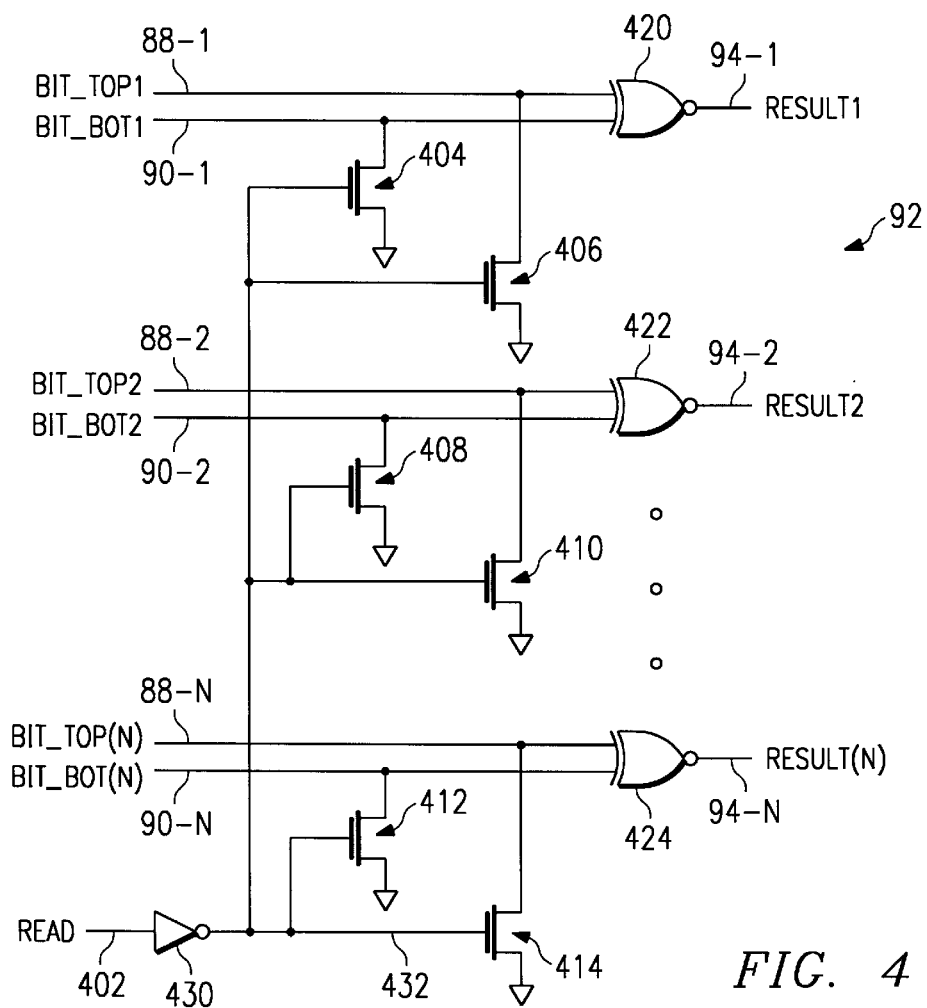
FIG. 4 is a schematic diagram of a compare logic circuit used with the invention.

In FIG. 4, compare logic circuits 92 that could be used in the embodiment of integrated circuit 10 receive a control read signal on lead 402 to enable exclusive-NOR comparison of the received data bits. Individual data signals for bits 1 through N of BIT_TOP test data bus 88 are received by comparison circuits on leads 88-1 through 88-N. Individual data signals for bits 1 through N of BIT_BOT test data bus 90 are received by comparison circuits on leads 90-1 through 90-N. Only three sets of leads and gates are depicted for clarity of the drawing, additional sets of leads and gates being used as desired.

The respective data bit signals on bus leads 88 and 90 connect to the two inputs of exclusive-NOR gates 420, 422 through 424. This provides for the comparison circuits to perform a logical exclusive-NOR comparison of the data carried on the test data buses 88 and 90. The result of this comparison occurs at the outputs of the exclusive-NOR gates on the respective bus leads 94, particularly leads 94-1, 94-2 through 94-N.

An inactive low read signal on lead 402, through inverter 430 and leads 432, turns on all of N-channel transistors 404,

406, 408, 410, 412 and 414 to pull any test data signals on test bus leads 88 and 90 to ground or an inactive low state. This forces the outputs of the exclusive-NOR gates to a logical high state. An active high read signal on lead 402, through inverter 430 and leads 432, turns off all of the N-channel transistors to allow the data signals appearing on the test bus leads 88 and 90 to drive the exclusive-NOR gates.

If all of the data bits are the same logical state, high or low, the outputs of all the gates will be a logical high state. If any one data bit on one test data bus is different from its corresponding data bit on the other test data bus, the output of that exclusive-NOR gate will be a logical low state.

While this arrangement of test circuits provides for writing test data to four times the number of memory cells than normal and the reading of two times the number of memory cells than normal, other arrangements are possible. With other arrangements of the arrays, other arrangements of the test circuits may be desired. Thus with 16 arrays of memory cells, it could be possible to write sixteen times the number of memory cells than normal. With additional test data busses, the reading of additional numbers of memory cells is possible. The number of test data busses used for reading becomes limited by the area of the chip available for the test data busses; enlarging the size of the chip increases the area available for the extra test data busses.

We claim:

1. An integrated circuit comprising:
   a. arrays of memory cells for storing bits of data;
   b. input and output circuits for conveying data bits to and from the integrated circuit;
   c. data bus leads extending between the arrays of memory cells and the input and output circuits, the data bus leads normally carrying the data bit signals between the arrays and input and output circuits;
   d. compare logic circuits producing a test output signals in response to comparing data bit signals from the arrays during testing of the integrated circuit;
   e. data read/test selector circuits selectively connecting the test output signals and the data bits from the arrays to the output circuits; and
   f. test bus leads extending between the arrays and the compare logic circuits, the test bus leads carrying data bit signals from the arrays to the compare circuits during test of the integrated circuit.

2. The integrated circuit of claim 1 in which there are four arrays and a set of data selector circuits between the data input circuits and each array to pass data signals from the input circuits to only one array.

3. The integrated circuit of claim 1 in which there are four arrays, data test selector circuits and two sets of test bus leads, the data test selector circuits selecting test data from two of the arrays for application to respective ones of the two sets of test bus leads.

4. A process of testing an integrated circuit comprising:
   a. performing normal reading and writing of data bit signals to arrays on the integrated circuits over first data bus leads on the integrated circuit; and
   b. performing test reading of data bit signals from arrays on the integrated circuit over second data bus leads on the integrated circuit.

5. The process of claim 4 including performing test writing of test data over all of the first data bus leads at the same time.

6. The process of claim 4 in which the performing test reading includes performing test reading from less than all of the memory arrays at one time.

* * * * *